(12) United States Patent
Hong et al.

(10) Patent No.: US 12,255,248 B2
(45) Date of Patent: Mar. 18, 2025

(54) SEMICONDUCTOR DEVICE INCLUDING BACKSIDE CONTACT STRUCTURE HAVING POSITIVE SLOPE AND METHOD OF FORMING THEREOF

(71) Applicant: SAMSUNG ELECTRONICS CO., LTD., Suwon-si (KR)

(72) Inventors: Wonhyuk Hong, Clifton Park, NY (US); Jongjin Lee, Clifton Park, NY (US); Taesun Kim, Ballston Spa, NY (US); Myunghoon Jung, Clifton Park, NY (US); Kang-ill Seo, Springfield, VA (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/540,280

(22) Filed: Dec. 14, 2023

(65) Prior Publication Data

US 2024/0290866 A1  Aug. 29, 2024

Related U.S. Application Data

(60) Provisional application No. 63/448,540, filed on Feb. 27, 2023.

(51) Int. Cl.
*H01L 23/528* (2006.01)
*H01L 21/8234* (2006.01)
(Continued)

(52) U.S. Cl.
CPC .......... *H01L 29/66545* (2013.01); *H01L 21/823437* (2013.01); *H01L 21/823475* (2013.01);
(Continued)

(58) Field of Classification Search
CPC ....... H01L 29/66545; H01L 21/823437; H01L 21/823475; H01L 29/0673; H01L 29/0847;
(Continued)

(56) References Cited

U.S. PATENT DOCUMENTS 11,276,643 B2  3/2022  Huang et al.
11,398,553 B2  7/2022  Lin et al.
(Continued)

OTHER PUBLICATIONS

Communication dated Sep. 5, 2024, issued by the European Patent Office in counterpart European Application No. 24157011.8.

*Primary Examiner* — Suberr L Chi
(74) *Attorney, Agent, or Firm* — Sughrue Mion, PLLC

(57) ABSTRACT

A system and a method are disclosed for forming a bottle-neck shaped backside contact structure in a semiconductor device, wherein the bottle-neck shaped backside contact structure has a first side partially within the first source/drain structure, a second side contacting a backside power rail, and a liner extending from the first side to the backside power rail. The liner includes a first region comprised of either a Ta silicide liner or a Ti silicide liner, a second region comprised of a Ti/TiN liner and a third region comprised of either a Ta silicide liner or a Ti silicide liner. The backside contact structure includes a first portion having a positive slope and a second portion, adjacent to the first portion, having no slope.

9 Claims, 11 Drawing Sheets

(51) Int. Cl.
*H01L 27/088* (2006.01)
*H01L 29/06* (2006.01)
*H01L 29/08* (2006.01)
*H01L 29/423* (2006.01)
*H01L 29/66* (2006.01)
*H01L 29/775* (2006.01)
*H01L 29/786* (2006.01)

(52) U.S. Cl.
CPC ........ *H01L 23/5286* (2013.01); *H01L 27/088* (2013.01); *H01L 29/0673* (2013.01); *H01L 29/0847* (2013.01); *H01L 29/42392* (2013.01); *H01L 29/66439* (2013.01); *H01L 29/775* (2013.01); *H01L 29/78696* (2013.01)

(58) Field of Classification Search
CPC ......... H01L 29/42392; H01L 29/78696; H01L 2221/1073; H01L 21/76829; H01L 21/76831; H01L 21/76856; H01L 21/02304; H01L 21/02362; H01L 23/481
See application file for complete search history.

(56) References Cited

U.S. PATENT DOCUMENTS

| | | | |
|---|---|---|---|
| 11,437,283 B2 | 9/2022 | Lilak et al. | |
| 11,563,003 B2 | 1/2023 | Zhang et al. | |
| 2018/0331101 A1* | 11/2018 | Anderson | H01L 21/823885 |
| 2021/0336019 A1 | 10/2021 | Su et al. | |
| 2021/0351303 A1 | 11/2021 | Ju et al. | |
| 2021/0375857 A1 | 12/2021 | Huang et al. | |
| 2022/0165848 A1 | 5/2022 | Lin et al. | |
| 2022/0406715 A1 | 12/2022 | Xie et al. | |
| 2024/0096751 A1* | 3/2024 | Li | H01L 21/823418 |
| 2024/0113193 A1* | 4/2024 | Li | H01L 21/823475 |

* cited by examiner

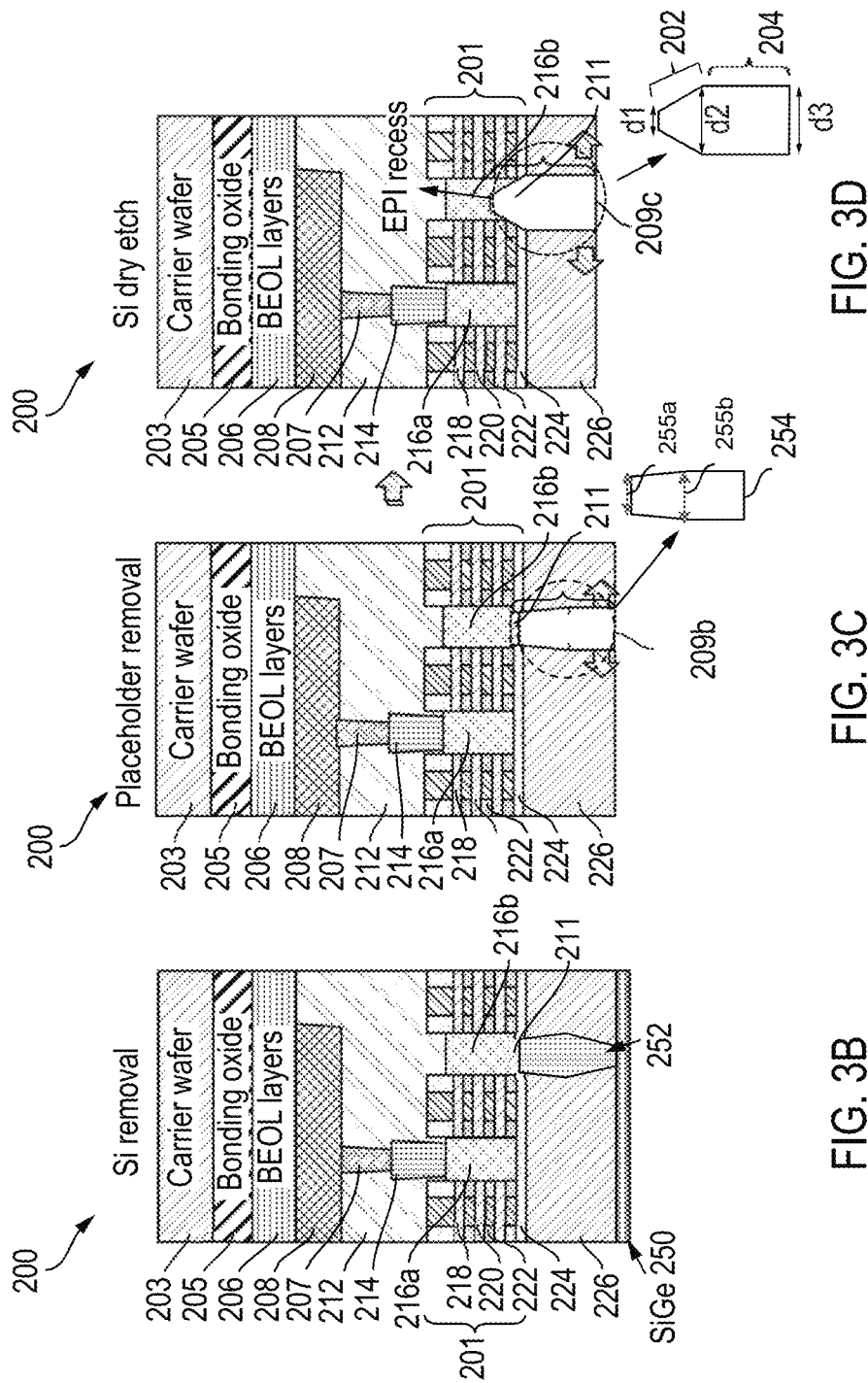

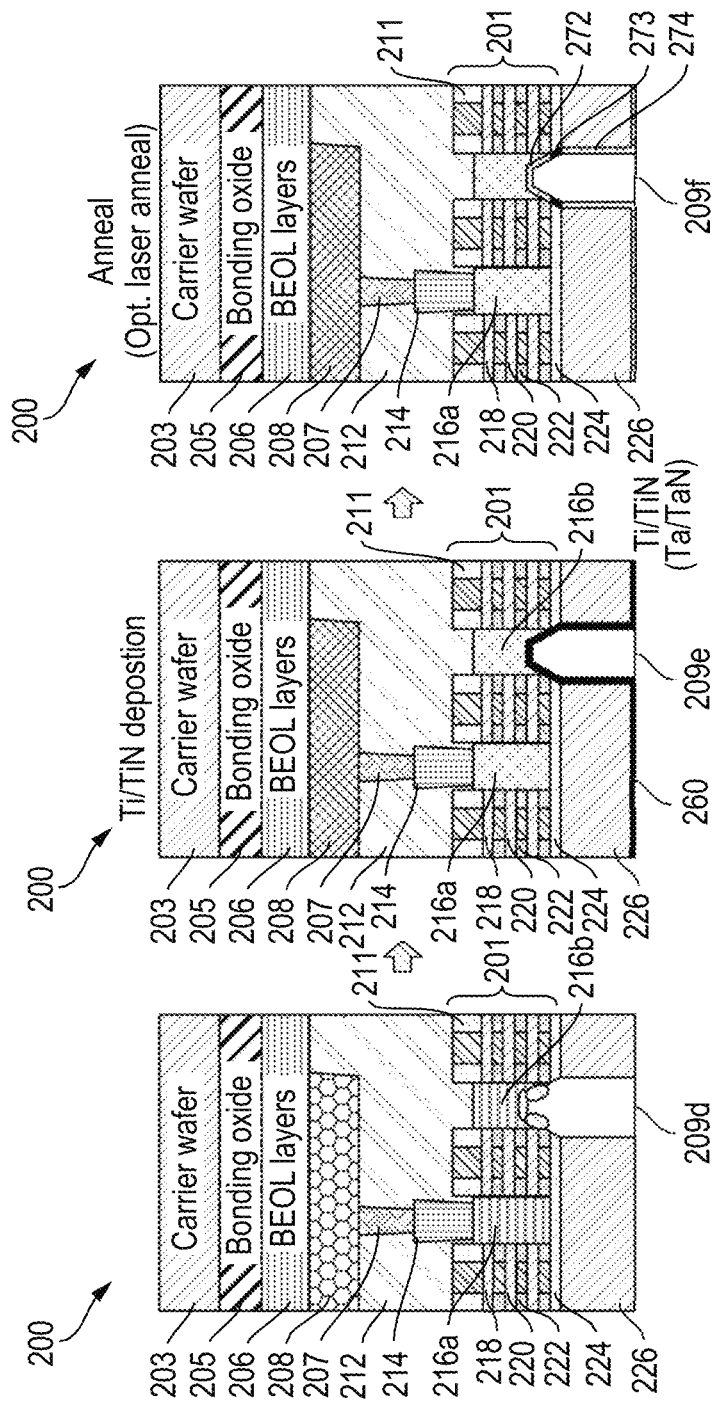

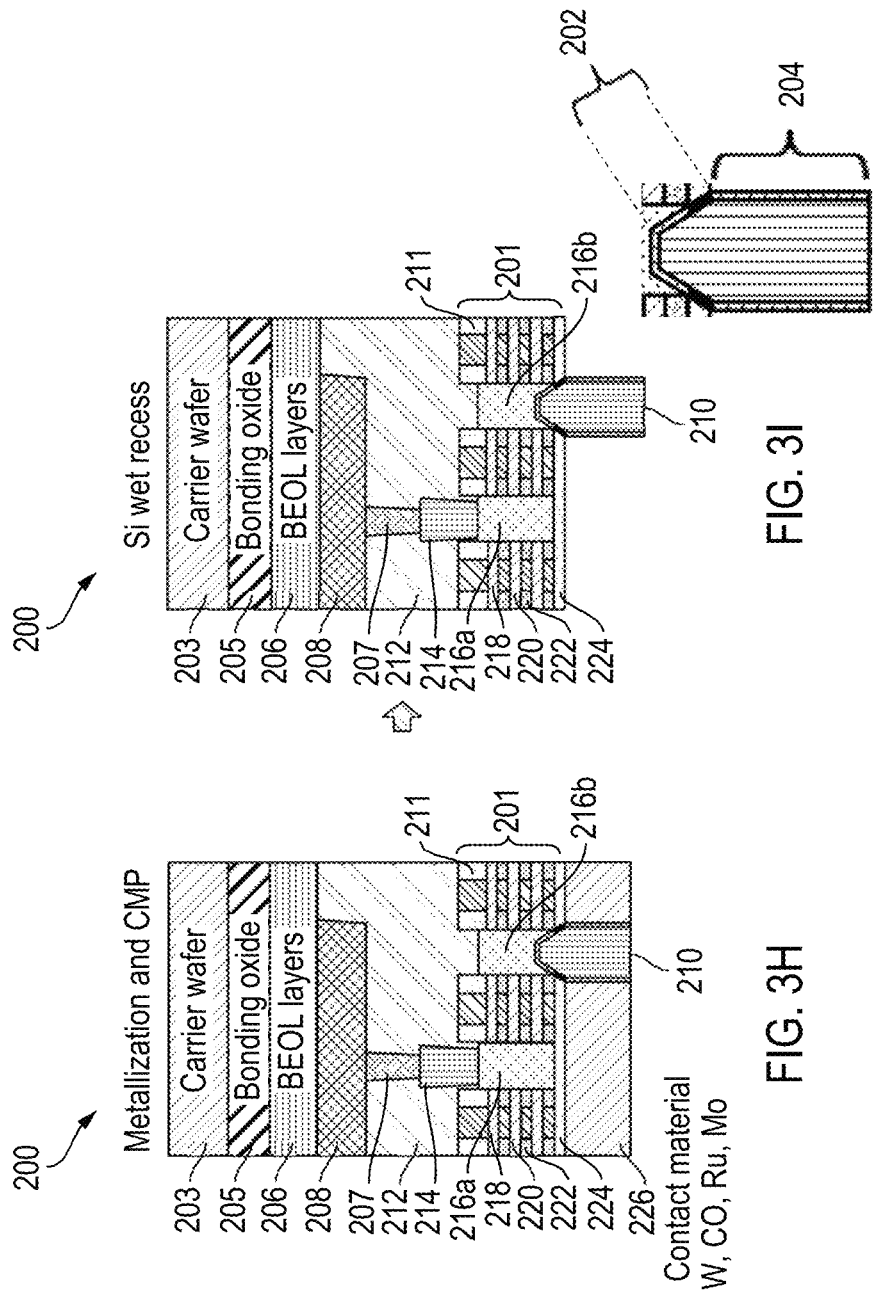

4000

Forming a bottle-neck shaped backside contact structure in a semiconductor device, the semiconductor device having two sides in a substrate and partially within a first source/drain structure of the semiconductor device, wherein the semiconductor device has one or more source/drain structures, one or more channel structures and wherein the substrate is on a first side of the semiconductor device; wherein the bottle-neck shaped backside contact structure includes:

a first side partially within the first source/drain structure and a second side contacting a backside power rail;

a first portion having a first slope that is a positive slope value and a second portion, adjacent to the first portion, the second portion having a second slope that is less than the first slope;

wherein the first portion and the second portion include: a liner extending from the first side to the backside power rail, wherein the liner includes a first region comprised of either a Ta silicide liner or a Ti silicide liner, a second region comprised of either a Ti/TiN liner and a third region comprised of either a Ta silicide liner or a Ti silicide liner.

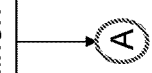

FIG. 4A

SEMICONDUCTOR DEVICE INCLUDING BACKSIDE CONTACT STRUCTURE HAVING POSITIVE SLOPE AND METHOD OF FORMING THEREOF

CROSS-REFERENCE TO RELATED APPLICATION

This application claims the priority benefit under 35 U.S.C. § 119 (e) of U.S. Provisional Application No. 63/448,540 filed on Feb. 27, 2023 entitled: "Backside Contact Formation Before Removal of Substrate," the disclosure of which is incorporated by reference in its entirety, as if fully set forth herein.

TECHNICAL FIELD

The disclosure generally relates to the field of semiconductors. More particularly, the subject matter disclosed herein relates to improvements to integrated circuit devices including backside contact structures.

BACKGROUND

At least to improve power rail effectiveness and prevent IR drop, a back-side power distribution network (BSPDN) has been developed in a semiconductor device structure including a field-effect transistor (FET) such as a nanosheet transistor. Some ways to connect a front side of the nanosheet transistor to a back side thereof have been proposed, including a front via backside power rail (FVBP), a direct backside contact (DBC), etc. Among them DBC is more effective than other contact structures connected to a back side in terms of process capability and dimension limitations. Currently, when the backside Si is removed, the placeholder is also recessed leading to issues with metal filling due to the poor profile of the backside contact structure. As such, there is a need for a profile improvement of the backside contact structure.

Further, in the conventional scheme, when laser annealing is used, the laser can pass through some areas that have silicon oxide and directly hit the BEOL layer, causing issues including electron migration.

To solve this problem, a new method is proposed herein.

Information disclosed in this Background section has already been known to or derived by the inventors before or during the process of achieving the embodiments of the present application, or is technical information acquired in the process of achieving the embodiments. Therefore, it may contain information that does not form the prior art that is already known to the public.

SUMMARY

To overcome these issues, systems and methods are described herein for forming a novel backside contact structure having a profile improvement are disclosed.

The above approaches improve on previous methods because the placeholder is removed in advance using a wet recess process, before the backside Si layer is removed. As such, placeholder recess can be avoided during Si recess. Further, as will be described in greater detail, the opening of the backside contact structure is widened due to a combination of processing steps described herein.

(A1) A device comprising, a semiconductor device on a substrate, the semiconductor device having at least two sides and the semiconductor device including: a backside contact structure, the backside contact structure vertically between a backside power rail and a first source/drain structure, wherein the backside contact structure comprises a first portion, having a first slope value that is a positive slope value, wherein the backside contact structure further comprises a second portion adjacent to the first portion, wherein the second portion has a second slope value that is greater than the positive slope value, the second portion extending from the first portion to a distance further distal from the first source/drain structure, wherein the first portion and the second portion include a liner.

(A2) The device of A1, wherein sidewalls of first portion and second portion are covered in the liner and wherein the liner sequentially includes a first region, a second region and a third region; wherein the first region is within the first source/drain, the first region comprised of a Ta, Ti silicide liner; wherein the second region is between the first region and the third region, and wherein the second region is coplanar with a bottom dielectric isolation layer, the second region comprised of a Ti/TiN liner; wherein the third region is below the second region, the third region comprised of a Ta, Ti silicide liner.

(A3) The device of A2, wherein the first portion of the backside contact structure includes the first region of the liner and the second region of the liner; and wherein the second portion of the backside contact structure includes the third region of the liner.

(A4) The device of A1, wherein the first portion has a first truncated-cone shaped structure, comprising a first diameter within the first source/drain region and a second diameter distal from the first source/drain and wherein the positive slope value is defined as the second diameter being greater than the first diameter.

(A5) The device of A4, wherein the second portion has a conical shaped structure having a third diameter, and wherein an infinite slope is defined as the third diameter being substantially constant and equal to the second diameter.

(A6) The device of A1, wherein the silicide material is at least between 1-8 nm in thickness.

(A7) The device of A1, wherein the backside contact structure is configured to have a bottleneck-shaped geometry with a mean diameter increase.

(A8) The device of A1, wherein the second region of the liner contacts a bottom dielectric isolation layer.

(A9) The device of A1, wherein the first portion has at least two sides, a first side facing the metal signal routing layers and a second side facing the backside power rail, wherein the first side is within the first source/drain and contacts the first source/drain.

(A10) The device of A1, wherein the first portion has a trapezoid shaped structure from a side-view.

(B1) A method of manufacturing an integrated circuit device, the method comprising: forming a bottleneck-shaped backside contact structure in a semiconductor device, the semiconductor device having two sides in a substrate and partially within a first source/drain structure of the semiconductor device, wherein the semiconductor device has one or more source/drain structures, one or more channel structures and wherein the substrate is on a first side of the semiconductor device. The bottleneck-shaped backside contact structure includes: a first side partially within the first source/drain structure and a second side contacting a backside power rail; a first portion having a first slope that is a positive slope value and a second portion, adjacent to the first portion, the second portion having a second slope value that is greater than the first slope; wherein the first portion and the second portion include: a liner extending from the first side to the backside power rail, wherein the liner includes a first region comprised of either a Ta silicide liner or a Ti silicide liner, a second region comprised of a Ti/TiN liner and a third region comprised of either a Ta silicide liner or a Ti silicide liner.

(B2) The method of (B1), wherein forming the bottleneck-shaped backside contact structure includes removing a backside Si layer; removing a placeholder; performing dry etching on the substrate.

(B3) The method of (B1), wherein forming the bottleneck-shaped backside contact structure further includes: performing a Ti/TiN deosition in a backside contact void.

(B4) The method of (B1), further comprising: performing a laser anneal step over the Ti/TiN deposition.

(B5) The method of claim (B4), further comprising: forming a metallization in the backside contact void.

(B6) The method of claim (B5), further comprising: performing chemical mechanical polish after forming the metallization, forming: the first portion of the bottleneck-shaped backside contact structure partially within the first source/drain structure, having a positive slope value, the second portion of the bottleneck-shaped backside contact structure adjacent to the first portion having an infinite slope and extending from the first portion to a distance further distal from the first source/drain.

(B7) The method of claim (B6), further comprising: forming a bottleneck-shaped backside contact structure in the backside contact void.

BRIEF DESCRIPTION OF DRAWING

In the following section, the aspects of the subject matter disclosed herein will be described with reference to exemplary embodiments illustrated in the figures, in which:

FIGS. 3A-3I depicts a method for forming the backside contact area of FIG. 2, according to an example embodiment of the present disclosure.

FIGS. 4A-4C are flowcharts for a process (depicted in FIGS. 3A-3I) for forming a backside contact structure illustrated in FIGS. 2 and 3I, according to an example embodiment of the present disclosure.

DETAILED DESCRIPTION

Figure 1:
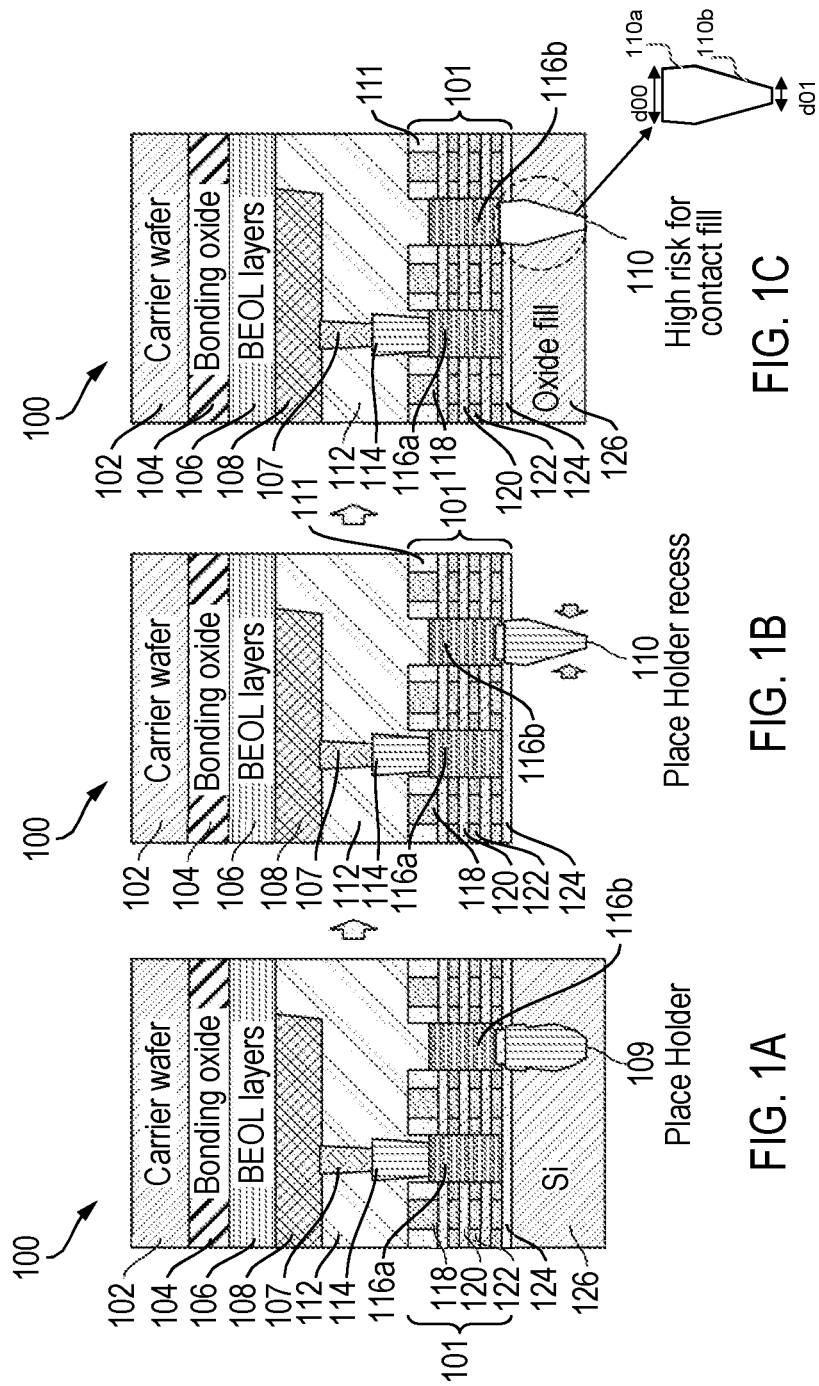
FIGS. 1A-1C depict a backside contact area to a semiconductor device, according to an example embodiment of the present disclosure.

In the following detailed description, numerous specific details are set forth in order to provide a thorough understanding of the disclosure. It will be understood, however, by those skilled in the art that the disclosed aspects may be practiced without these specific details. In other instances, well-known methods, procedures, components and circuits have not been described in detail to not obscure the subject matter disclosed herein.

Reference throughout this specification to "one embodiment" or "an embodiment" means that a particular feature, structure, or characteristic described in connection with the embodiment may be included in at least one embodiment disclosed herein. Thus, the appearances of the phrases "in one embodiment" or "in an embodiment" or "according to one embodiment" (or other phrases having similar import) in various places throughout this specification may not necessarily all be referring to the same embodiment. Furthermore, the particular features, structures or characteristics may be combined in any suitable manner in one or more embodiments. In this regard, as used herein, the word "exemplary" means "serving as an example, instance, or illustration." Any embodiment described herein as "exemplary" is not to be construed as necessarily preferred or advantageous over other embodiments. Additionally, the particular features, structures, or characteristics may be combined in any suitable manner in one or more embodiments. Also, depending on the context of discussion herein, a singular term may include the corresponding plural forms and a plural term may include the corresponding singular form. Similarly, a hyphenated term (e.g., "two-dimensional," "pre-determined, etc.) may be occasionally interchangeably used with a corresponding non-hyphenated version (e.g., "two dimensional," "predetermined," etc.), and a capitalized entry may be interchangeably used with a corresponding non-capitalized version. Such occasional interchangeable uses shall not be considered inconsistent with each other.

Also, depending on the context of discussion herein, a singular term may include the corresponding plural forms and a plural term may include the corresponding singular form. It is further noted that various figures (including component diagrams) shown and discussed herein are for illustrative purpose only, and are not drawn to scale. For example, the dimensions of some of the elements may be exaggerated relative to other elements for clarity. Further, if considered appropriate, reference numerals have been repeated among the figures to indicate corresponding and/or analogous elements.

The terminology used herein is for the purpose of describing some example embodiments only and is not intended to be limiting of the claimed subject matter. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being on, "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and case of discussion only; it does not imply that the construction or architectural details of such components or units are the same across all embodiments or such commonly-referenced parts/modules are the only way to implement some of the example embodiments disclosed herein.

Unless otherwise defined, all terms (including technical and scientific terms) used herein have the same meaning as commonly understood by one of ordinary skill in the art to which this subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "module" refers to any combination of software, firmware and/or hardware configured to provide the functionality described herein in connection with a module. For example, software may be embodied as a software package, code and/or instruction set or instructions, and the term "hardware," as used in any implementation described herein, may include, for example, singly or in any combination, an assembly, hardwired circuitry, programmable circuitry, state machine circuitry, and/or firmware that stores instructions executed by programmable circuitry. The modules may, collectively or individually, be embodied as circuitry that forms part of a larger system, for example, but not limited to, an integrated circuit (IC), system on-a-chip (SoC), an assembly, and so forth.

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), formed on one substrate or other appropriate architectures. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random-access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present disclosure.

Referring to FIGS. 1A-1C, a conventional structure for the backside contact area to a semiconductor device is depicted, according to an example embodiment of the present disclosure. Backside contact area and backside contact structure are used interchangeably herein. The semiconductor device structure 100 is depicted with front-side and backside contacts, the details of which will be provided. The semiconductor device structure 100 may have a suitable thickness.

Before delving into the specifics of the semiconductor device structure 100, it is important to note that the backside contact area 110 shown in FIGS. 1B and 1C has a negative slope. In some embodiments, negative slope is when the diameter of a backside contact area (BSCA) 110 nearest the transistor 101 (e.g., first diameter d00) is wider than the diameter of the BSCA 110 furthest from the transistor structure (e.g., second diameter d01). When the backside contact area has a negative slope, issues such as bad metal filling properties and metal over-filling are prevalent. A negative slope could also make a void inside during metal filling, which could lead to a disconnect between the contact metal to source/drain 116b, as we have explored in U.S. patent application Ser. No. 18/197,381. As such, U.S. patent application Ser. No. 18/197,381 is incorporated by reference herein in its entirety. However, when a BSCA (e.g., BSCA 210 shown in FIG. 2) has a positive slope (e.g., a positive slope value), the limitations associated with a negative slope, as described herein, can be avoided. As used herein, "positive slope value" or "positive slope" (described in more detail below, in reference to the description for FIG. 2) is when the diameter of the BSCA (e.g., backside contact area 210 shown in FIG. 2) nearest the transistor structure 201 is smaller than the diameter of the BSCA 210 furthest from the transistor structure 201.

Referring now to FIG. 1 in greater detail, a semiconductor device structure 100 having front-side and back-side contacts is shown. The semiconductor device structure 100 includes a substrate layer 126, which may comprise a low-K dielectric ILD material such as SiO2. In other embodiments, the substrate layer 126 may be made of any material distinct from SiO2. The substrate layer 126 may have any suitable thickness. For example, the substrate layer may have a thickness in the range from 1000 Angstroms to 2000 Angstroms.

Semiconductor device 101 is disposed on the substrate layer 126, with a first semiconductor side adjacent to substrate layer 126 and a second semiconductor side adjacent to a middle-of-line (MOL) layer 112. The semiconductor device 101 may include any active or passive devices, such as FET transistors, BJTs, diodes, resistors, etc. In the embodiment shown in FIG. 1, semiconductor device 101 is a FET transistor, comprising a first source-drain 116a, a second source-drain 116b separated from the first source-drain 116a in the X direction (perpendicular to the Y direction).

The semiconductor device 101 also includes a channel 120 connecting the first and second source-drains 116a-b in the X direction and a gate structure 118 adjacent to, and at least partially enveloping or surrounding the channel structure 120.

The source-drains may be terminals for the semiconductor device 101 and may be on opposing sides of the channel structure 120. Thus, the illustrated semiconductor device 101 may be a nanosheet FET transistor. In other embodiments, the semiconductor device 101 may be a finFET transistor, nanowire transistor, planar transistor, or any other form of transistor having one or more terminals. Alternatively, semiconductor device 101 may comprise various passive devices such as diodes, resistors, etc. having one or more terminals.

Upon the semiconductor device 101 and opposite the substrate 126 may be a middle-of-line (MOL) layer 112. The MOL layer 112 may comprise a bulk low-K dielectric ILD material such as SiO2. Within the MOL layer 112 may be formed one or more contact plugs 114 that contact a source-drain 116a of semiconductor device 101 from above, as well as one or more contact vias 107, contacting the contact plug 114 from above, and contacting a metal line 108 of the back-end-of-line (BEOL) layers 106 from below, as will be discussed further below. The contact plug 114 may include cobalt, tungsten, molibdenium, ruthenium, a transition metal with barrier metal, or barrier-less metal, among other similar possibilities. In alternative embodiments, contact plug 114 (and associated via 107) may instead provide contact between a metal line 108 of the BEOL layers 106 and the gate 118, providing for signal routing. In this example, the metal line 108 may be a signal routing metal line.

Upon the MOL layer 112 (that is, stacked in the Y direction), and opposite the semiconductor device 101, may be a group of layers collectively called the back-end-of-line (BEOL) layers 106. BEOL layers 106 may comprise a bulk low-K dielectric ILD material such as SiO2. Within the BEOL layers 106 are a series of stacks of metal lines 108 within a series of metal layers (one shown for convenience), the metal lines 108 running parallel to the major surfaces of the substrate and the BEOL layers 106. The metal lines 108 may be adjacent to and contact vias such as via 107 to provide power or signals to semiconductor device 101. The metal lines 108 within BEOL 106 may be connected by vias in a similar manner, but are not shown here for brevity reasons. One of ordinary skill in the art would recognize the connections within BEOL layers 106.

Upon the BEOL layers 106 there may be a bonding oxide 104 which may be a silicon oxide of 3000-5000 Angstroms in thickness. In other embodiments, the thickness of bonding oxide 104 may be outside the range of 3000-5000 Angstroms.

Upon the bonding oxide 104 may be a carrier wafer 102 which may be a bulk silicon wafer.

Importantly, the substrate 126 also comprises at least one metal line that may serve as a backside power rail (BPR) which is not shown. To connect the backside power rail to the source-drain 116b of the semiconductor device 101, a backside contact area 110 is formed, thus allowing power to flow from power rail (not shown) to source-drain 116b.

However, some methods of forming the backside contact 110, can cause significant issues with the metal filling within backside contact area 110. For example, contact plug 110 may include cobolt, tungsten, molybdenum, ruthenium, a transition metal with barrier metal, or barrier-less metal. A negative slope from the frontside could cause a number of issues, including a high risk for the backside contact area 110 to be overfilled. As illustrated in FIG. 1C, the shape of backside contact area 110, (e.g., the negative slope of BSCA 110, in which the diameter of the BSCA 110 nearest the transistor 101 is wider than the diameter of the BSCA 110 furthest from the transistor structure 101), may lead to overfilling of the metal in the BSCA 110, potentially damaging the functionality of any circuit including semiconductor device 101.

Figure 2:
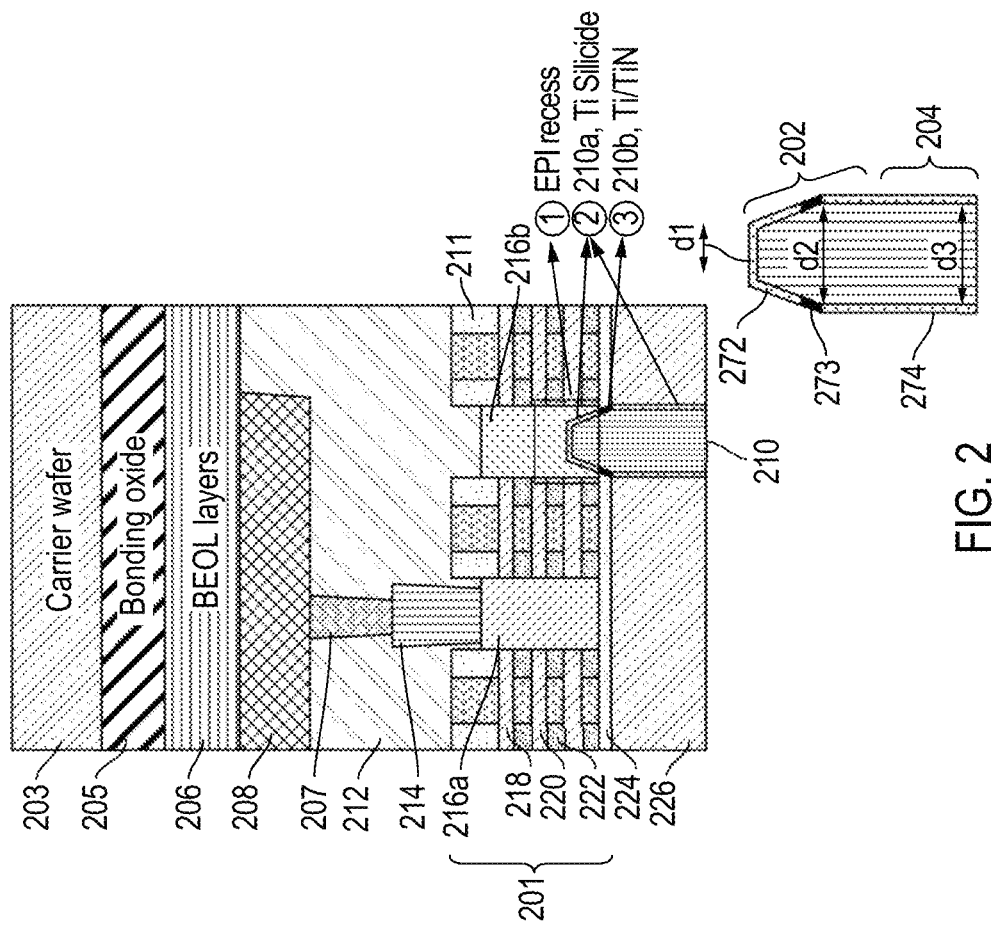
FIG. 2 depicts a profile improvement of a backside contact area to a semiconductor device, according to an example embodiment of the present disclosure.

FIG. 2 depicts a profile improvement of a backside contact area to a semiconductor device, according to an example embodiment of the present disclosure.

Semiconductor device structure 200 may be similar in some ways to semiconductor device structure 100. For example, semiconductor device 101 may have similar properties to semiconductor device 201, carrier wafer 102 may have similar properties to carrier wafer 203, bonding oxide 104 may have similar properties to bonding oxide 205, BEOL layers 106 may have similar properties to BEOL layers 206, metal lines 108 may have similar properties to metal lines 208, MOL 112 may have similar properties to MOL 212, contact plug 114 may have similar properties to contact plug 214, source drain 116a-b may have similar properties to source drain 216a-b, channel 120 may have similar properties to channel 220, interlayer 122 may have similar properties to interlayer 222, BDI structure 124 may have similar properties to BDI structure 224, substrate 126 may have similar properties to substrate 226. BDI 124 may have a composition that prevents silicide formation. For example, BDI 124 may be one composed entirely or partially of one of the following: SiBCN, SiO2, SiN, SiCO. In some embodiments, semiconductor device structure 200 has elements and properties that are significantly different from semiconductor device structure 100, including but not limited to backside contact area 210. Other similarities to semiconductor device structure 100 may exist that are not explicitly recited herein.

As used herein, profile improvement of the BSCA 210 may refer to an improvement in the overall structure or geometry of the BSCA 210, allowing for improved metal filling properties. As will be described with reference to FIGS. 3A-3I, it is important to note, among other aspects, that the backside contact structure 210 is shown with a pattern of layers (which may be repeating) including at least one truncated-cone shaped portion 202 (also referred to herein as first portion 202) and one cylindrical-shaped portion 204 (also referred to herein as second portion 204). In some embodiments the method for forming the backside contact area 210 (as described in FIGS. 3A-3I) having at least one truncated-cone shaped portion 202 and one cylindrical shaped portion 204 is, among other features, a significant difference leading to the profile improvement of backside contact structure 210 in FIG. 2. In some embodiments, as will be described in greater detail, the backside contact area 210 includes at least first portion 202 and second portion 204. The method used to form BSCA 210 is described in greater detail in the description for FIGS. 3A-3I. The improved profile of backside contact area 210 results in an average "positive" slope, which in turn reduces the likelihood of metal overfilling when depositing the metal of backside contact area 210.

The semiconductor device structure 200 includes a substrate layer 226, which may comprise a low-K dielectric ILD material such as SiO2. In other embodiments, the substrate layer 226 may be made of any material distinct from SiO2. The substrate layer 226 may have any suitable thickness. For example, the substrate layer may have a thickness in the range from 1000 Angstroms to 2000 Angstroms.

Semiconductor device 201 is disposed on the substrate layer 226, with a first semiconductor side adjacent to substrate layer 226 and a second semiconductor side adjacent to a middle-of-line (MOL) layer 212. The semiconductor device 201 may be formed in the Y direction, and may include any active or passive devices, such as FET transistors, BJTs, diodes, resistors, etc. In the embodiment shown in FIG. 2, semiconductor device 201 is a FET transistor, comprising a first source-drain 216a, a second source-drain 216b separated from the first source-drain 216a in the X direction (perpendicular to the Y direction).

The semiconductor device 201 also includes a channel 220 connecting the first and second source-drains 116a-b in the X direction and a gate structure 218 adjacent to, and at least partially enveloping or surrounding the channel structure 220. The source-drains may be terminals for the semiconductor device 201 and may be on opposing sides of the channel structure 220. Thus, the illustrated semiconductor device 201 may be a nanosheet transistor. In other embodiments, the semiconductor device 201 may be a FinFET transistor, nanowire transistor, planar transistor, or any other form of transistor having one or more terminals. Alternatively, semiconductor device 201 may comprise various passive devices such as diodes, resistors, etc. having one or more terminals.

Upon the semiconductor device 201 and opposite the substrate 226 may be a middle-of-line (MOL) layer 212. The MOL layer 212 may comprise a bulk low-K dielectric ILD material such as SiO2. Within the MOL layer 212 may be formed one or more contact plugs 214 that contact a source-drain 216a of semiconductor device 201 from above, as well as one or more contact vias 207, contacting the contact plug 214 from above, and contacting a metal line 208 of the back-end-of-line (BEOL) layers 206 from below, as will be discussed further below. The contact plug 214 may include cobolt, tungsten, molibdenium, ruthenium, a transition metal with barrier metal, or barrier-less metal.

Upon the MOL layer 212 (that is, stacked in the Y direction), and opposite the semiconductor device 201, may be a group of layers collectively called the back-end-of-line (BEOL) layers 206. BEOL layers 206 may comprise a bulk low-K dielectric ILD material such as SiO2. Within the BEOL layers 206 are a series of stacks of metal lines 208 within a series of metal layers (one shown for convenience), the metal lines 208 running parallel to the major surfaces of the substrate and the BEOL layers 206. The metal lines 208 may be adjacent to and contact vias such as via 207 to provide power or signals to semiconductor device 201. The metal lines 208 within BEOL 206 may be connected by vias in a similar manner, but are not shown here for brevity reasons. One of ordinary skill in the art would recognize the connections within BEOL layers 206.

Upon the BEOL layers 206 there may be a bonding oxide 205 which may be a silicon oxide of 3000-5000 Angstroms in thickness.

Upon the bonding oxide 205 may be a carrier wafer 215 which may be a bulk silicon wafer.

Importantly, the substrate 226 also comprises at least one metal line that may serve as a backside power rail (BPR). To connect the backside power rail (not shown) to the source-drain 216b of the semiconductor device 201, a backside contact area 210 (also referred to herein as backside contact structure 210) is formed, thus allowing power to flow from power rail to source-drain 216b.

The backside contact structure 210 may at least include, a first portion 202 and a second portion 204, as shown in FIG. 3. The first portion 202 may be partially within source-drain 216b. The two side-walls 202a-b of the first portion 202 are adjacent to and contact the source-drain region 216b, BDI 224 and substrate 226. The first portion 202 may have a positive slope. The first portion 202 has a first diameter, d1 and a second diameter d2. The first diameter d1 may be equal to the diameter of top-most portion of BSCA 210 within source/drain region 216b. The backside contact structure 210 has a positive slope when the diameter, d1 of first portion 202, adjacent or nearest to semiconductor device 201 is small and a second diameter, d2 distal from the semiconductor device 201 is larger than diameter d1. With this wide to narrow conical geometry, a positive slope is formed in first portion 202 when the second diameter d2 is wider than first diameter d1. The ratio of wide to narrow proportion or ratio may depend on the diameter of the source/drain 216b. Second diameter d2 of first portion 202 may depend on the diameter d1 of first portion 202.

The backside contact structure 210 may also include a second portion 204 adjacent to, directly contacting and beneath the first portion 202. The second portion 204 may have a cylindrical shape having a substantially constant third diameter, d3 throughout the entire second portion 204 and having an infinite slope. The "infinite slope" is defined as the third diameter, d3 being substantially constant and equal to the diameter of the portion(s) directly interfacing with it (in this example, second diameter, d2 of first portion 202). The second portion 204 extends from the first portion 202 to a distance further away from the source/drain 216b. In certain embodiments, the overall BSCA 210 may have a profile composed of any number greater than or equal to 1 of a continuous infinite slope (e.g., second portion 204 and other portions identical to second portion 204) and positive slope segments (e.g., first portion 202).

Importantly, the first portion 202 and second portion 204 may be covered in a liner and the liner may sequentially include a first region 272, a second region 273 and a third region 274. The first portion 202 may include the first region 272 of the liner, the second region 273 of the liner, and the third region 274 of the liner.

The first region 272 of the liner may be within the source drain, the first region 272 may comprise either a Ta silicide liner or a Ti silicide liner. In some embodiments, an alternative material may be used that achieves similar properties as the Ti silicide or Ta silicide liner. The second region 273 may be between the first region 272 and the third region 274, and coplanar with the BDI. The second region 273 and may be comprised of a Ti/TiN liner. In some embodiments, second region 273 may be comprised of a Ta/TaN liner. The third region 274 may be below the second region 273 and the third region 274 and may be comprised of a Ti silicide liner or a Ta silicide liner. In some embodiments, the liner may be entirely comprised of a Ti silicide liner. In other embodiments, the liner may be comprised of a Ti silicide liner with the exception of the second region 273. In some embodiments, the entirety of the liner (including the first region 272, second region 273, third region 274) may have a thickness between 1-8 nm. If PVD Ti is used, the thickness of the liner may be between 6-8 nm. If CVD Ti is used, the thickness of the liner may be between 2-5 nm.

FIG. 3A-3I depict forming an improved backside contact area 210 (shown in FIG. 2) of a semiconductor device structure 200, according to an example embodiment of the present disclosure. In some embodiments, the profile improvement to backside contact area 210 is an improvement over the backside contact area 110 discussed in FIG. 1.

Figure 3A:
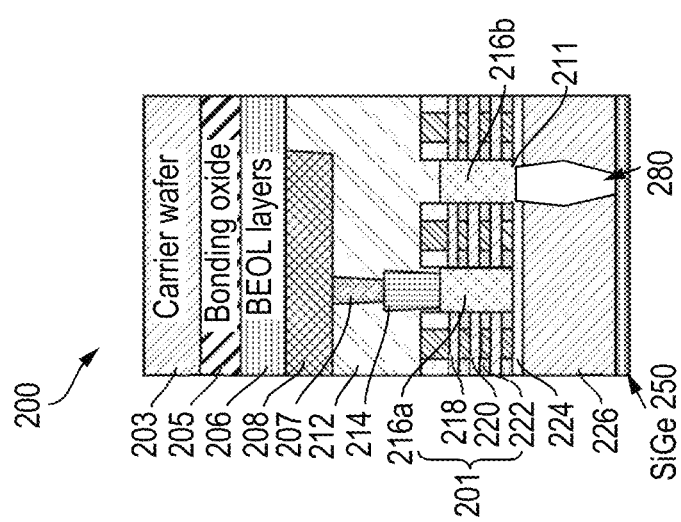

FIG. 3A depicts providing a contact a placeholder hole, according to some embodiments. Placeholder hole 280 may connect the backside power rail to the first source/drain structure 216b, the contact placeholder hole having: a first portion contacting the first source/drain structure, having a positive slope, a second portion adjacent to the first portion having an infinite slope and extending from the first portion to a distance further distal from the first source/drain 216b.

FIG. 3B depicts providing placeholder 252 in the placeholder hole, according to some embodiments. It is important to note that although FIG. 3B shows placeholder 252, the placeholder may be provided by a user or external entity. In some embodiments, providing the placeholder 252 includes providing a contact placeholder connecting the backside power rail (not shown) to the first source/drain structure 216b, the placeholder having: a first portion contacting the first source/drain structure 216b, having a positive slope value, a second portion adjacent to the first portion having an infinite slope and extending from the first portion to a distance further distal from the first source/drain. A thin Si capping layer 211 may be used to prevent source/drain 216b epi damage during the placeholder removal process from the backside.

FIG. 3C depicts removal of the SiGe layer 250 from semiconductor device structure 200. In some embodiments, a wet recess process is used before SiGe 250 removal. As such, the placeholder 252 recess may be avoided during Si removal. Further, the top opening 254 of a BSCA 209b can be increased due to backside Si recess, as shown in FIG. 3C.

Next, as shown in FIG. 3C, the placeholder 252 is removed, forming BSCA 209b with a "wide" opening portion 254. In some embodiments, first diameter 255a and second diameter 255b of BSCA 209b may be substantially similar in length.

In some embodiments, when the placeholder 252 is removed by ammonia based wet chemical, it also recesses the BSCA 209c. Since the top portion of the BSCA 209c (e.g., the portion within source/drain 216b) is exposed first, the top of the BSCA 209c is removed more than bottom, causing a wide top opening as shown in FIG. 3C.

Next, as shown in FIG. the Si capping layer 211 may be removed completely (e.g., through a Si dry etching process). The Si dry etching process creates a, resulting BSCA 209c that exhibits a first portion (e.g., first portion 202 shown in FIG. 2) that has a first truncated-cone shaped structure, the first portion 202 having a positive slope and a second portion 204 (e.g., second portion 204 shown in FIG. 2) that has a conical shaped structure, the second portion 204 having an infinite slope. In other words, first portion 202 included first diameter d1 within source/drain region 216b and a second diameter d2 further from the first/source drain region 216b, the first diameter d1 being smaller than the second diameter d2. The second portion 204 includes third diameter d3, where the third diameter d3 is substantially constant and equal to the second diameter d2. The epitaxy recess depth may be from 10~30 nm. In other embodiments, the depth may be outside this range. A deep epitaxy recess may also help to decrease interface resistance due to increased contact area. In some embodiments, etching into the source/drain 216b may also be also evident in FIG. 3D. The profile improvement in BSCA 209c when compared to BSCA 209b in FIG. 3B is noticeable when comparing the overall profile of BSCA 209b and BSCA 209c.

Next, as shown in FIG. 3E show the process which makes amorphous epi and recrystallization epi using ion implantation or laser anneal in the BSCA 209d.

In order to achieve low contact resistance, ion implantation and a doping process is used. Also, for doping activation, laser anneal may be needed especially for nFET. So, FIG. 3E means doping activated and crystalized epi process to make good silicide at FIGS. 3F and 3G. Next, as shown in FIG. 3F, Ti/TiN may be deposited over the BSCA 209e and further on a portion of substrate 226. In some embodiments, Ta/TaN may be used instead of Ti/TiN. PVD, ALD and CVD processes are used for Ti/TiN layer. During the Ti/TiN deposition, Silicide can be formed at the interface between Si and Ti.

Turning to FIG. 3G, semiconductor device 300 undergoes a laser annealing step, forming a silicide liner over the BSCA 209f. Ti silicide may surround the BSCA 209f because Ti/TiN barrier metal is deposited before Si removal.

In some embodiments, the laser annealing step is optional and may also be substituted with another step that results in similar physical and chemical properties. The liner includes a first region 272, a second region 273 and a third region 274, as previously described in the description for FIG. 2. An outer portion 260 of substrate 226 also forms a silicide liner. The smooth texture provided through laser annealing and the chemical composition as a silicide may provide improved connectivity. Importantly, as discussed in FIG. 2, Ti/TiN (or alternatively Ta/TaN) remains present at second region 273 and does not form a silicide layer, since it is in contact with the BDI 224.

Turning to FIG. 3H, the deposition of a metal layer and chemical mechanical polishing (CMP) step is depicted. This creates the finalized BSCA 210, and which may further polish the substrate 226 to a fine plane, removing any silicide liner from outer portion 260 (outer portion 260 is shown in FIG. 3F).

Turning to FIG. 3I, Si layer 226 (also referred to herein as substrate 226) is removed. Although it is not depicted in the figures, a first interlayer dielectric (ILD) structure may be formed on the source/drain region structures 216a-216b. In some embodiments, a low k-based ILD substrate is deposited on BDI structure 224 and around the BSCA 210. The low k-based ILD substrate may be a Si-based substrate.

Figure 4B:
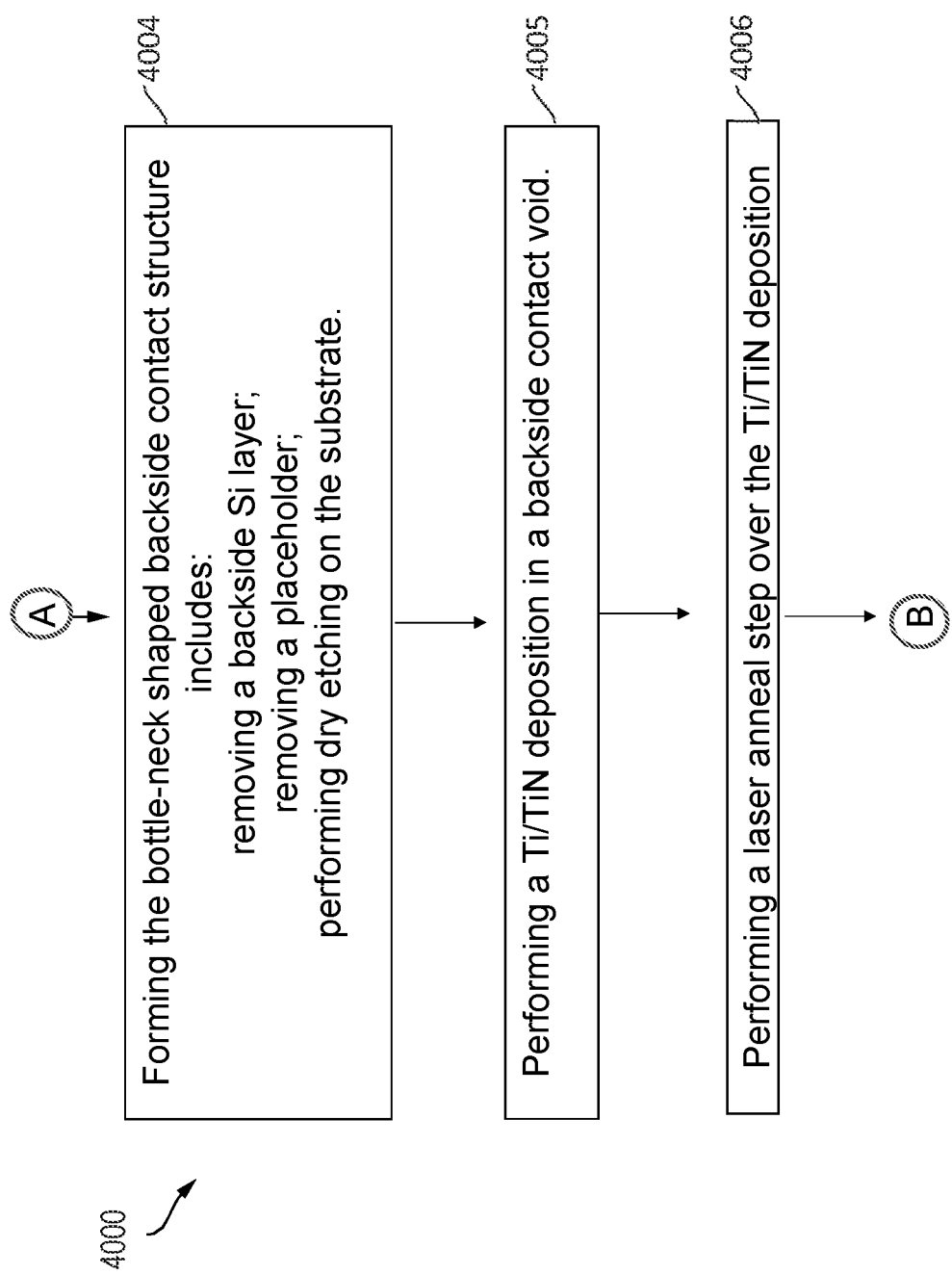
Figure 4C:
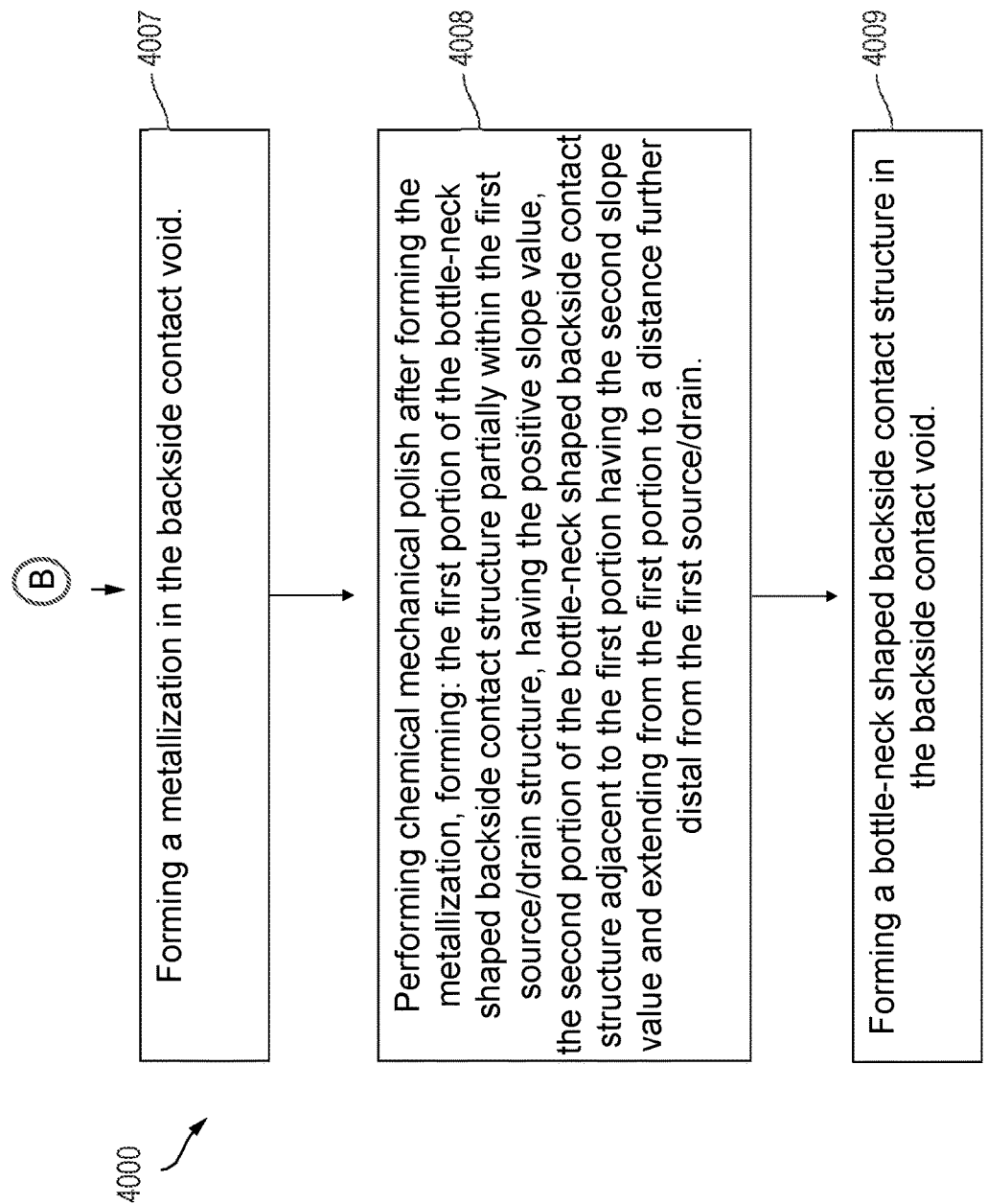

FIGS. 4A-4C are flowcharts for a process (depicted in FIGS. 3A-3I) for forming a backside contact structure illustrated in FIG. 2, according to an example embodiment of the present disclosure.

The method 4000 which further includes forming operation 4001 is illustrated visually in at least FIGS. 3A-3I. More specifically, forming a bottleneck-shaped backside contact structure in semiconductor device 200 is shown in FIGS. 2 and 3I, where the semiconductor device 200 has two sides in a substrate 226 and partially within the first source/drain structure 216 a-b of the semiconductor device, wherein the semiconductor device has one or more source/drain structures 216a-b, one or more channel structures and wherein the substrate is on a first side of the semiconductor device.

As shown in FIG. 2, the bottleneck-shaped backside contact structure 210 has a first side partially within the first source/drain structure 216b, a second side contacting a backside power rail (not shown), and a liner extending from the first side to the backside power rail. The liner includes a first region 272 of either a Ta silicide liner or a Ti silicide liner, a second region 273 comprised of a Ti/TiN liner, and a third region 274 comprised of either a Ta silicide liner or a Ti silicide liner.

The backside contact structure 210 includes a first portion 202 having a positive slope value and a second portion 204, adjacent to the first portion, wherein the second portion has a slope that is greater than the positive slope. For example, the slope of the second portion can be any value that is greater than the value of the positive slope (e.g., the slope of the first portion). Forming the bottleneck-shaped backside contact structure 210 includes: removing a backside Si layer 250; removing a placeholder 252 and performing dry etching on the substrate.

The method 4000 which further includes forming operation 4004 is illustrated visually in at least FIG. 3A-3C. More specifically, forming the bottleneck-shaped backside contact structure 210 includes: removing a backside Si layer 250 shown in 3A and 3B where SiGe layer 250 is removed. Further, the method 2004 of removing a placeholder 252 is shown in FIGS. 3B and 3C where placeholder 252 is removed. The method 4004 of performing dry etching on the substrate is shown in 3D where dry etching of backside contact structure 209c forms a unique backside contact profile.

The method 4000 which further includes performing operation 4005 is illustrated visually in at least FIG. 3E. Specifically, performing a Ti/TiN deposition 282 in a backside contact void 209e is depicted. In some embodiments, Ta/TaN may be used instead of Ti/TiN.

The method 4000 which further includes performing operation 4006 is illustrated visually in at least FIG. 3F.

Specifically, performing a laser anneal step over the Ti/TiN deposition 282 is depicted, forming a liner comprised of a first region 272, a second region 273 and a third region 274.

The method 4000 which further includes forming operation 4007 is illustrated visually in at least FIG. 3H. Specifically, forming a metallization in the backside contact.

The method 4000 which further includes performing operation 4008 is illustrated visually in at least FIG. 3H. Specifically, performing chemical mechanical polish after forming the metallization, forming: the first portion of the bottleneck-shaped backside contact structure partially within the first source/drain structure, having a first slope that is a positive slope value, the second portion of the bottleneck-shaped backside contact structure adjacent to the first portion having a second slope value that is greater than the first slope value and extending from the first portion to a distance further distal from the first source/drain.

The method 4000 which further includes forming operation 4009, illustrated visually in at least FIG. 3I. More specifically, forming 4009 a bottleneck-shaped backside contact structure 210 in the backside contact void is shown throughout FIGS. 3A-3I, the resulting backside contact structure depicted in FIG. 3I.

Figure 5:
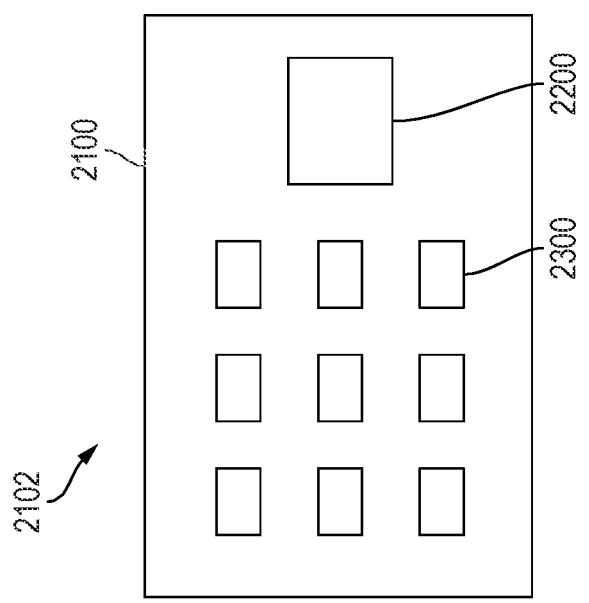
FIG. 5 depicts a semiconductor package, according to an example embodiment of the present disclosure.

FIG. 5 depicts a semiconductor package 2102 according to an example embodiment of the present disclosure. The semiconductor package 2102 may include a processor 2200 and semiconductor units 2300 that are mounted on a substrate 2100. The processor 2200 and/or the semiconductor units 2300 may include one or more of the semiconductor devices 200 of FIG. 2 described above.

Figure 6:
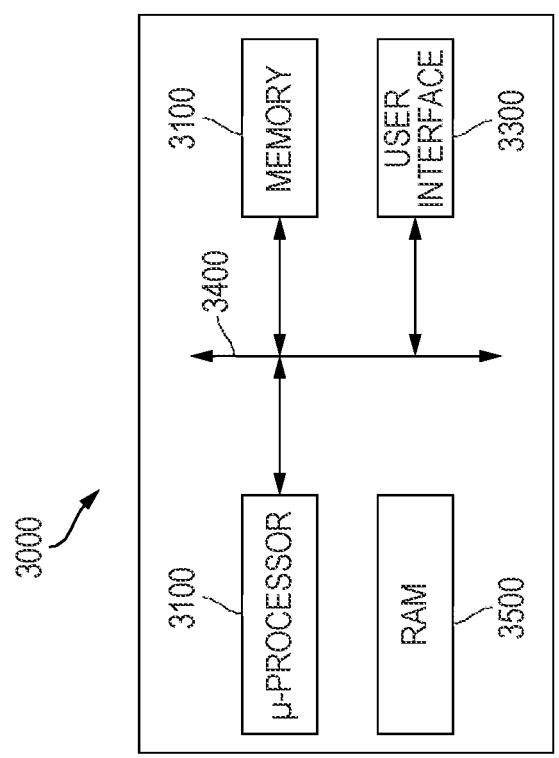
FIG. 6 depicts a schematic block diagram of an electronic system, according to an example embodiment of the present disclosure.

FIG. 6 depicts a schematic block diagram of an electronic system according to an example embodiment.

Referring to FIG. 6, an electronic system 3000 in accordance with an embodiment may include a microprocessor 3100, a memory 3200, and a user interface 3300 that perform data communication using a bus 3400. The microprocessor 3100 may include a central processing unit (CPU) or an application processor (AP). The electronic system 3000 may further include a random-access memory (RAM) 3500 in direct communication with the microprocessor 3100.

The microprocessor 3100 and/or the RAM 3500 may be implemented in a single module or package. The user interface 3300 may be used to input data to the electronic system 3000, or output data from the electronic system 3000. For example, the user interface 3300 may include a keyboard, a touch pad, a touch screen, a mouse, a scanner, a voice detector, a liquid crystal display (LCD), a micro light-emitting device (LED), an organic light-emitting diode (OLED) device, an active-matrix light-emitting diode (AMOLED) device, a printer, a lighting, or various other input/output devices without limitation. The memory 3200 may store operational codes of the microprocessor 3100, data processed by the microprocessor 3100, or data received from an external device. The memory 3200 may include a memory controller, a hard disk, or a solid-state drive (SSD).

At least the microprocessor 3100, the memory 3200 and/or the RAM 3500 in the electronic system 3000 may be the semiconductor devices 201 of FIG. 2.

Embodiments of the subject matter and the operations described in this specification may be implemented in digital electronic circuitry, or in computer software, firmware, or hardware, including the structures disclosed in this specification and their structural equivalents, or in combinations of one or more of them. Embodiments of the subject matter described in this specification may be implemented as one or more computer programs, i.e., one or more modules of computer-program instructions, encoded on computer-storage medium for execution by, or to control the operation of data-processing apparatus. Alternatively, or additionally, the program instructions can be encoded on an artificially-generated propagated signal, e.g., a machine-generated electrical, optical, or electromagnetic signal, which is generated to encode information for transmission to suitable receiver apparatus for execution by a data processing apparatus. A computer-storage medium can be, or be included in, a computer-readable storage device, a computer-readable storage substrate, a random or serial-access memory array or device, or a combination thereof. Moreover, while a computer-storage medium is not a propagated signal, a computer-storage medium may be a source or destination of computer-program instructions encoded in an artificially-generated propagated signal. The computer-storage medium can also be, or be included in, one or more separate physical components or media (e.g., multiple CDs, disks, or other storage devices). Additionally, the operations described in this specification may be implemented as operations performed by a data-processing apparatus on data stored on one or more computer-readable storage devices or received from other sources.

While this specification may contain many specific implementation details, the implementation details should not be construed as limitations on the scope of any claimed subject matter, but rather be construed as descriptions of features specific to particular embodiments. Certain features that are described in this specification in the context of separate embodiments may also be implemented in combination in a single embodiment. Conversely, various features that are described in the context of a single embodiment may also be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described herein. Other embodiments are within the scope of the following claims. In some cases, the actions set forth in the claims may be performed in a different order and still achieve desirable results. Additionally, the processes depicted in the accompanying figures do not necessarily require the particular order shown, or sequential order, to achieve desirable results. In certain implementations, multitasking and parallel processing may be advantageous.

As will be recognized by those skilled in the art, the innovative concepts described herein may be modified and varied over a wide range of applications. Accordingly, the scope of claimed subject matter should not be limited to any of the specific exemplary teachings discussed above, but is instead defined by the following claims.

The abstract is provided to comply with 37 C.F.R. Section 1.72 (b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. A method of manufacturing an integrated circuit device, the method comprising:
   forming a bottleneck-shaped backside contact structure in a semiconductor device, the backside contact structure having two sides in a substrate and partially within a first source/drain structure of the semiconductor device, wherein the semiconductor device has one or more source/drain structures, one or more channel structures and wherein the substrate is on a first side of the semiconductor device;
   wherein the forming the bottleneck-shaped backside contact structure is performed such that the bottleneck-shaped backside contact structure includes:
   a first side partially within the first source/drain structure and a second side opposite to the first side;
   a first portion having a first slope that has a positive slope and a second portion, adjacent to the first portion, the second portion having a second slope that has a greater slope value than the first slope; and
   the first portion and the second portion include: a liner extending from the first side to the second side, wherein the liner includes a first region comprised of either a Ta silicide liner or a Ti silicide liner, a second region comprised of a Ti or TiN liner and a third region comprised of either a Ta silicide liner or a Ti silicide liner.

2. The method of claim 1, wherein the forming the bottleneck-shaped backside contact structure includes:
   removing a backside Si layer;
   removing a placeholder; and
   performing dry etching on the substrate.

3. The method of claim 1, wherein the forming the bottleneck-shaped backside contact structure further includes:
   performing a Ti or TiN deposition in a backside contact void.

4. The method of claim 3, further comprising:
   performing a laser anneal step over the Ti or TiN deposition.

5. The method of claim 4, further comprising:
   forming a metallization in the backside contact void.

6. The method of claim 5, further comprising:
   performing chemical mechanical polishing after forming the metallization, forming,
   wherein the forming the bottleneck-shaped backside contact structure is performed such that:
   the first portion of the bottleneck-shaped backside contact structure is partially within the first source/drain structure, having the positive slope, and
   the second portion of the bottleneck-shaped backside contact structure is adjacent to the first portion, and has the second slope that has a greater slope value than the positive slope of the first portion, and extends from the first portion to a distance further distal from the first source/drain structure.

7. The method of claim 6, further comprising:
   forming a bottle neck-bottleneck-shaped backside contact structure in the backside contact void.

8. The method of claim 1, wherein the second slope has an infinite slope value.

9. The method of claim 1, wherein the first region and the second region of the liner are on the first portion of the bottleneck-shaped backside contact structure, and the third region of the liner is on the second portion of the bottleneck-shaped backside contact structure.

* * * * *